United States Patent
Ghionea et al.

(10) Patent No.: US 9,829,524 B2
(45) Date of Patent: Nov. 28, 2017

(54) ELECTRIC FIELD SENSOR

(71) Applicant: U.S. Army Research Laboratory ATTN: RDRL-LOC-I, Adelphi, MD (US)

(72) Inventors: Simon J. Ghionea, Laurel, MD (US); David M. Hull, Adelphi, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 77 days.

(21) Appl. No.: 14/704,535

(22) Filed: May 5, 2015

(65) Prior Publication Data

US 2016/0327597 A1  Nov. 10, 2016

(51) Int. Cl.
*G01R 29/12* (2006.01)
*G01R 29/24* (2006.01)

(52) U.S. Cl.
CPC .................... *G01R 29/12* (2013.01)

(58) Field of Classification Search
CPC .......... G01V 3/02; B60R 21/015; H05B 1/02; B60N 2/00
See application file for complete search history.

(56) References Cited

U.S. PATENT DOCUMENTS

| | | |
|---|---|---|
| 3,641,427 A | 2/1972 | Pittman et al. |
| 3,662,260 A | 5/1972 | Thomas et al. |
| 7,411,401 B1 | 8/2008 | Hull et al. |
| 7,920,975 B2 | 4/2011 | Hull et al. |
| 2008/0237624 A1* | 10/2008 | Kang ............ H01L 33/486 257/99 |
| 2008/0309243 A1* | 12/2008 | Cooley .......... H05B 37/0227 315/158 |
| 2015/0261377 A1* | 9/2015 | Reynolds ........ G06F 3/0416 345/174 |
| 2016/0075297 A1* | 3/2016 | Lamesch ........ B60N 2/002 324/603 |

OTHER PUBLICATIONS

D. J. Malan and B. F. J. Schonland, "An Electrostatic Fluxmeter of Short Response-time for use in Studies of Transient Field-changes," Proc. Phys. Soc. B, vol. 63, No. 6, p. 402-408, Jan. 1950.

S. G. Gathman and R. V. Anderson, "Improved Field Meter for Electrostatic Measurements," Review of Scientific Instruments, vol. 36, No. 10, pp. 1490-1493, Oct. 1965.

J. L. Haseborg and H. Trinks, "Detection of Projectiles by Electric Field Measurements," IEEE Transactions on Aerospace and Electronic Systems, vol. AES-16, No. 6, pp. 750-754, Nov. 1980.

(Continued)

*Primary Examiner* — Jermele M Hollington
*Assistant Examiner* — Zannatul Ferdous
(74) *Attorney, Agent, or Firm* — Eric Brett Compton

(57) ABSTRACT

An electric field sensor having at least a first and second electrically conductive generally planar electrodes that are spaced apart from each other. A circuit is electrically connected to the electrodes which is configured to generate an output signal proportional to a time derivative of a varying electric field surrounding the electrodes. Optionally, three sets of spaced apart electrodes which are arranged perpendicularly relative to each other are used for three-dimensional measurements of the electric field.

20 Claims, 1 Drawing Sheet

(56) References Cited

OTHER PUBLICATIONS

H. Trinks and J. L. Haseborg, "Electric Field Detection and Ranging of Aircraft," IEEE Transactions on Aerospace Electronic Systems, vol. 18, pp. 268-274, May 1982.

Stephen Vinci et al., "Electric-field sensors for bullet detection systems," Proc. SPIE 9082, Active and Passive Signatures V, 908205 (Jun. 4, 2014) From Conference vol. 9082, Baltimore, MD, USA | May 5, 2014.

Product Information for "709-2 High Sensitivity Precision Wide Band Electronic Field Sensor With Integral Optical Analog Transmission System," NanoFast Inc. 416 West Erie Chicago Il. 60610 (undated, but in possession of at least one of the inventors prior to filing date of the patent application).

"Electrostatic Sensor," Quasar Federal Systems, available online at: http://www.quasarfs.com/pages/success-stories-electrostatic-sensor.html. (accessed Dec. 12, 2016). Copyright 2016 (but believed to be available prior to filing date of the patent application).

"Epic Sensor," Plessy Semiconductor Limited, available online at: http://www.plesseysemiconductors.com/products/epic-sensor. (accessed Dec. 12, 2016), Copyright 2016 (but believed to be available prior to filing date of the patent application).

M. A. Krupka, et al., "Development and Test of Free Space Electric Field Sensors with Microvolt Sensitivity," available online at: www.dtic.mil/cgi-bin/GetTRDoc?AD=ADA409234 ((Report dated Sep. 1, 2001).

\* cited by examiner

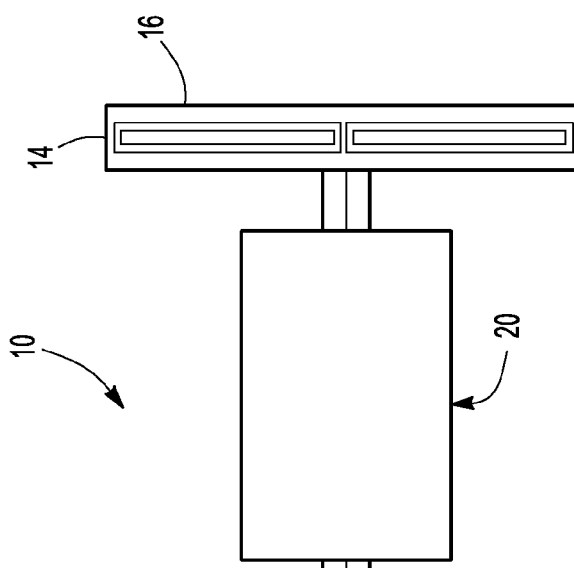
*Fig-2*
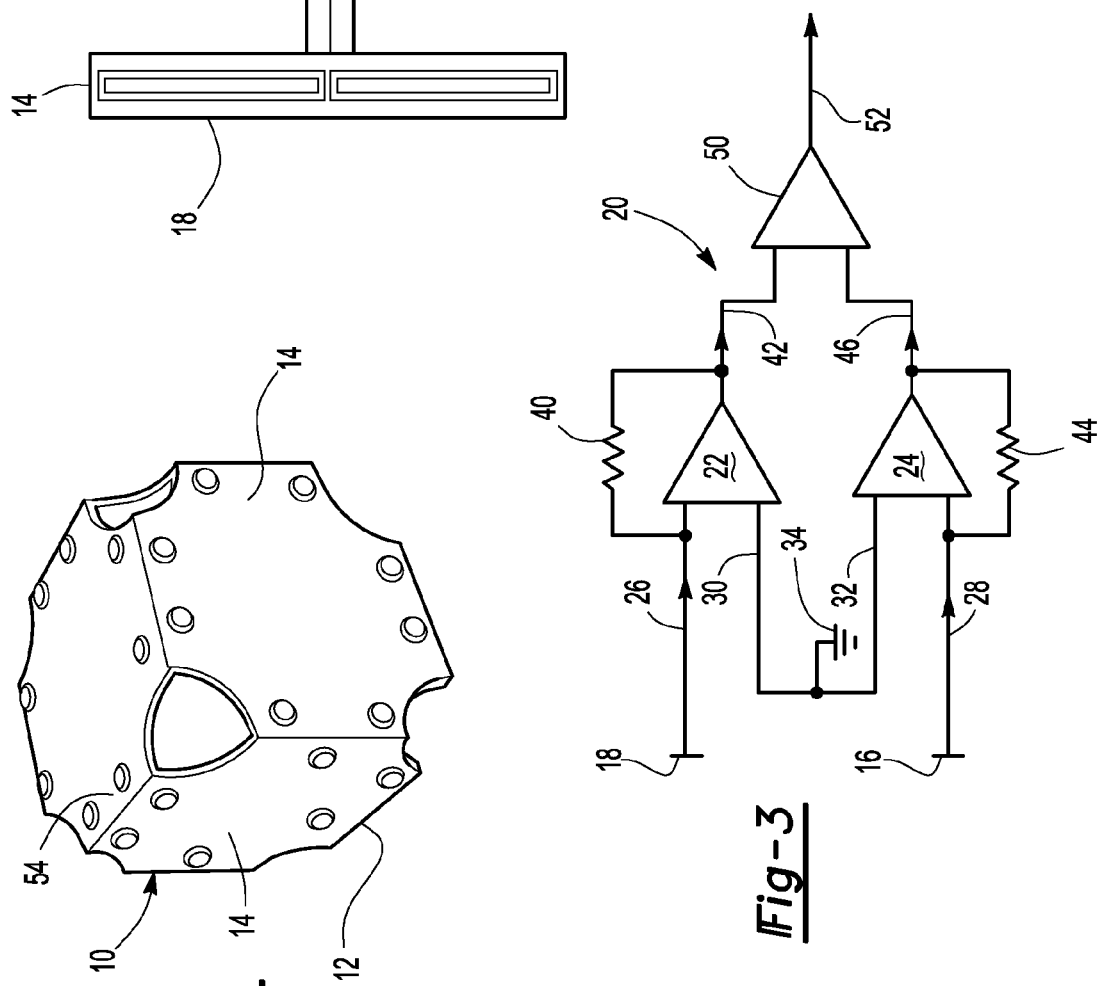
*Fig-1*
*Fig-3*

ELECTRIC FIELD SENSOR

GOVERNMENT INTEREST

The invention described herein may be manufactured, used, and licensed by or for the United States Government.

BACKGROUND OF THE INVENTION

I. Field of the Invention

The present invention relates generally to electric field sensors.

II. Description of Related Art

There have been previously known electric field sensors used to detect the strength of a varying electric field. These electric field sensors are used in many different applications where monitoring of the E- or B-field is required.

For example, such E-field sensors may be used in the detection and trajectory measurement of charged particles. Such charged particles may be created, for example, during the firing of bullets or other armory, particle accelerators, and even dust.

Similarly, such electric field sensors may be used to measure signals passing on unshielded communication interfaces and electric buses. As such, these previously known electric field sensors may be used for communication snooping.

Electric field sensors are also used in power line sensing applications. For example, such applications include the detection of energized wires, wire localization, automatic emergency wire avoidance, as well as line following or navigation.

Still other applications for electric field sensors include weather monitoring such as lightning detection and charged thundercloud detection. Such weather applications not only facilitate weather prediction, but also form an alarm signal of dangerous weather conditions.

Electric field sensors are also used for the detection of potential hazardous conditions in industries where a spark-induced explosion may cause substantial damage. For example, petroleum refineries, paper mills, textile mills, plastic fabrication, microelectronic fabrication, and other industrial applications are all subject to spark-induced explosions or sensitive damage from electrostatic discharge (ESD) which may result from a high E-field. Furthermore, electrostatic forces caused by high E-fields, or the lack of such forces, can result in unwanted movement or deformations during the precision manufacturing fabrication.

There have been previously known electric field sensors. However, these previously known electric field sensors all suffer from a number of common disadvantages.

First, the previously known electric field sensors are primarily single axis sensors which measure the electric field, or the time derivative of the electric field, only along a single axis. In order to obtain three-dimensional measurements of the electric field, it is necessary to physically reposition the electric field sensor along a different axis and then repeat the measurements of the electric field.

A still further disadvantage of the previously known electric field sensors is that many such electric field sensors require an earth ground in order to obtain the electric field measurement. In many situations, however, it is inconvenient, or even impossible, to obtain an earth ground for the sensor.

A still further disadvantage of the previously known electric field sensors is that such sensors provide only a small output signal, e.g. a few microvolts, as the output signal from the sensor representative of the strength or time derivative of the electric field. Such small output signals are inherently subject to error due to the difficulty of instrumentation required to measure the small output signals.

SUMMARY OF THE PRESENT INVENTION

The present invention provides an electric field sensor which overcomes all of the above-mentioned disadvantages of the previously known electric field sensors. In brief, the electric field sensor includes three sets of spaced apart planar electrodes wherein each set of electrodes is orthogonal relative to the other electrodes. As such, the three sets of electrodes form a cube structure with the conductive portion of each electrode facing outwardly from the cube. Consequently, when the cube is placed within an electric field, the cube can be oriented so that one set of electrodes is aligned with the X axis, a second set of electrodes aligned with the Y axis, and the final set of electrodes aligned with the Z axis of three-dimensional space.

A circuit is associated with each set of electrodes which provides an output signal proportional to the time derivative of the electric field. If desired, this time derivative output signal may be integrated to provide a measurement of the magnitude of the electric field.

Each of the three electric circuits includes a pair of transimpedance amplifiers in which one input of one amplifier is connected to one electrode and the corresponding input of the other transimpedance amplifier connected to the other electrode. The second set of inputs for the transimpedance amplifiers are connected directly to each other to form a virtual ground. When the cube is placed within a varying electric field, the transimpedance amplifiers, due to their very low input impedance, allow current flow between the two electrodes and the magnitude of this current flow is proportional to the magnitude of the time derivative of the electric field.

A resistor is coupled between the electrode input of each transimpedance amplifier and the output from the transimpedance amplifier to convert the current flow to a voltage. The two voltage signals from the two transimpedance amplifiers are then coupled as input signals to a differential amplifier. Since the voltage output signal from each transimpedance amplifier is out of phase 180 degrees from the other transimpedance amplifier, the differential amplifier effectively doubles the output signal, which is now a voltage signal, from the differential amplifier thus facilitating measurement of the output voltage from the differential amplifier by measurement instrumentation.

Since the transimpedance amplifiers are electrically connected together to form a virtual ground, actual grounding of the electric field sensor is unnecessary. Furthermore, since the three sets of electrodes are orthogonal relative to each other, the sensor provides three output signals, each of which is proportional to the time derivative of the electric field along the axis of the electrodes.

BRIEF DESCRIPTION OF THE DRAWING

A better understanding of the present invention will be had upon reference to the following detailed description when read in conjunction with the accompanying drawing, wherein like reference characters refer to like parts throughout the several views, and in which:

FIG. 1 is an elevational view illustrating an electric field sensor according to the present invention;

FIG. 2 is a diagrammatic plan illustrating one set of electrodes and the associated circuit for the electric field sensor; and FIG. 3 is a schematic diagram of the circuit for the electric sensor.

DETAILED DESCRIPTION OF A PREFERRED EMBODIMENT OF THE INVENTION

With reference first to FIG. 1, a preferred embodiment of the time derivative E-field sensor 10 according to the present invention is shown. The sensor 10 includes a housing 12 in the shape of a cube. As such, the housing 12 includes six sides 14 each of which is generally planar. Additionally, the six sides are arranged in three sets of spaced apart and parallel sides 14 which are arranged orthogonally relative to each other. Consequently, when positioned in free space, one set of spaced apart electrodes may be aligned with the X axis, a second set of spaced apart sides 14 aligned with the Y axis, while the final set of spaced apart sides aligned with the Z axis.

Although the sensor 10 is illustrated as a cube with planar sides, other shapes may be used. For example, the shape of the sensor may be symmetric or non-symmetric, spherical, etc. The electrodes could be ⅙ of a sphere, or ⅙ of a 3-D cruciform, etc. They can be symmetric or non-symmetric (like a non-cubic rectangular prism). They can form an open, or partially closed, or completely closed surface (completely closed provides the best shielding, but no good way to get the signals out over wires). They could even be segmented to form the surface of an artillery projectile or a glider. These various alternate geometries may be useful for certain applications, but not for others.

With reference now to FIG. 2, a portion of the electric field sensor 10 is shown for sensing the time derivative of the electric field along one orthogonal axis. Since the electric field sensors for the other two axes are identical, the electric field sensor will be described only with respect to one axis, it being understood that the same description shall also apply to the other two orthogonal axes.

Still referring to FIG. 2, two spaced apart sides 14 of the housing are shown. The housing is constructed of any conventional nonconductive material and all sides 14 of the housing 12 are electrically isolated from each other.

An electrically conductive electrode 16 is formed on an outer surface of one side 14 while, similarly, an electrically conductive electrode 18 is formed on the outer or outwardly facing side of the other side 14 of the sensor 10. These electrodes 16 and 18 may be applied to the sides 14 of the housing 12 in any conventional fashion, such as a copper coating or copper deposition.

Referring now to FIGS. 2 and 3, an electrical circuit 20 is contained within the housing which is electrically connected, in a manner to be shortly described, to both electrodes 16 and 18. It will be understood, of course, that a separate electronic circuit 20 is also electrically connected to each of the other two sets of sides 14 of the housing 12.

The operation of the circuit 20 is best described with reference to FIG. 3 and includes a first transimpedance amplifier 22 and a second transimpedance amplifier 24. In the conventional fashion, each transimpedance amplifier 22 and 24 exhibits a very low impedance on its inputs.

A negative input of the transimpedance amplifier 22 is electrically connected to the electrode 18. Similarly, the negative input 28 of the second transimpedance amplifier 24 is electrically connected to the other electrode 16. The other two inputs 30 and 32 of the transimpedance amplifiers 22 and 24 are of opposite polarity than the inputs 26 and 28. These two inputs 30 and 32 are electrically connected together to form a virtual ground 34.

When the two electrodes 16 and 18 are positioned within a varying electric field, current flows between the electrodes 16 and 18 through the transimpedance amplifiers 22 and 24. The magnitude of the current flowing between the electrodes 16 and 18 is proportional to the magnitude of the time derivative of the varying electric field in which the sensor is positioned.

Still referring to FIG. 3, a resistor 40 is connected between the input 26 and an output 42 of the first transimpedance amplifier 22 while, similarly, a resistor 44 of the same value is electrically connected between the input 28 and an output 46 of the second transimpedance amplifier 24. These resistors 40 and 44 effectively convert current signal detected by the transimpedance amplifiers 22 and 24 into a voltage signal at the outputs 42 and 46 of the transimpedance amplifiers 22 and 24 which is more easily measured than a current signal.

The two outputs 42 and 46 of the transimpedance amplifiers 22 and 24, respectively, are coupled as input signals to a differential amplifier 50 having an output 52. Since the direction of the current through the inputs 26 and 28 of the transimpedance amplifiers 22 and 24 are opposite in direction and thus effectively out of phase by 180 degrees, the magnitude of the voltage signal at the output 52 from the differential amplifier 50 is effectively doubled. This, in turn, facilitates measurement of the voltage signal at the differential amplifier output 52 by the measurement instrumentation.

Any convenient method, such as electrical wires, a one wire digital output, optical fibers, etc., may be used to communicate the output 52 from the differential amplifiers 50. Furthermore, as best shown in FIG. 1, the housing 12 preferably includes an opening 54 at at least one of its corners through which the wires, fiber optics, etc. may pass. Still other means, such as analog integrators to convert the D-dot signal to an E-field signal, integrated A/D converters, and digital communications, both wired and wireless, may also be used.

A primary advantage of the present invention is the minimization of the number of different printed circuit boards (PCBs) that are needed, namely one board (×6) for the electrodes, and another board (×3) for the amps. The use of rectangular plastic blocks to assemble the six sides ensures good orthogonality (and thus, good rejection of cross-axis fields) without the need for precise alignment frames. The transimpedance amps cause the electrodes to be held at the same (virtual) potential. Unlike with high-impedance E-field sensors (e.g., electric potential gradiometers), this allows the sensor to have very low potential gradients inside the sensor. Thus, the electrodes provide a degree of shielding (and commensurate better noise figures) for the sensitive preamps inside.

Aspects related to this invention have been previously disclosed in the article: Stephen Vinci et al., "Electric-field sensors for bullet detection systems," Proc. SPIE 9082, Active and Passive Signatures V, 908205 (Jun. 4, 2014) from Conference Volume 9082, Baltimore, Md., USA|May 5, 2014, which the inventors are co-authors. That article is herein incorporated by reference in its entirety.

From the foregoing, it can be seen that the electric field sensor of the present invention provides several advantages over the previously known sensors. First, since the sensor is arranged in the configuration of a cube, simultaneous readings of the time derivative of the electric field along all three orthogonal axes may be made without reorientation of the sensor. A still further advantage is that, since the sensor circuit 20 utilizes a virtual ground 34, no actual grounding of the sensor to earth is required.

Having described our invention, however, many modifications thereto will become apparent to those skilled in the art to which it pertains without deviation from the spirit of the invention as defined by the scope of the appended claims.

We claim:

1. An electric field sensor comprising:
   a first and second electrically conductive electrode which are spaced apart from each other; and
   a circuit electrically positioned between and connected to said electrodes which is configured to generate an output signal proportional to a time derivative of an electric field surrounding said electrodes, wherein the electrodes shield the circuit from external fields,
   wherein each electrode is patterned into an outer metal layer of a printed circuit board.

2. The sensor as defined in claim 1 wherein said electrodes are planar and generally parallel to each other.

3. The sensor as defined in claim 1 wherein said circuit measures current flow between said electrodes.

4. The sensor as defined in claim 3 wherein the circuit comprises a first and second transimpedance amplifier, one input of said first transimpedance amplifier electrically connected to said first electrode and one input of said second transimpedance amplifier electrically connected to said second electrode, a second input of each transimpedance amplifier being electrically connected together, and a differential amplifier having two inputs connected respectively to an output from each transimpedance amplifier, an output from said differential amplifier forming said output signal.

5. The sensor as defined in claim 4 wherein the circuit further comprises a resistor connected between said one input and said output of each transimpedance amplifier, which resistor converts a current signal to a voltage signal.

6. An electric field sensor comprising:
   a first and second electrically conductive electrode which are spaced apart from each other; and
   a circuit electrically positioned between and connected to said electrodes which is configured to generate an output signal proportional to a time derivative of an electric field surrounding said electrodes, wherein the electrodes shield the circuit from external fields, wherein said circuit measures current flow between said electrodes,
   the circuit comprising a first and second transimpedance amplifier, one input of said first transimpedance amplifier electrically connected to said first electrode and one input of said second transimpedance amplifier electrically connected to said second electrode, a second input of each transimpedance amplifier being electrically connected together, and a differential amplifier having two inputs connected respectively to an output from each transimpedance amplifier, an output from said differential amplifier forming said output signal, and
   wherein signals on said transimpedance amplifier outputs are 180 degrees out of phase from each other so that the output from the differential amplifier is doubled.

7. An electric field sensor comprising:
   a first and second electrically conductive electrode which are spaced apart from each other;
   a third and fourth electrically conductive electrode which are spaced apart from each other and lie in a plane perpendicular to said first and second electrodes;
   a fifth and sixth electrically conductive electrode which are spaced apart from each other and lie in a plane perpendicular to said first and second electrode and also perpendicular to said third and fourth electrodes; and
   a circuit electrically connected to said electrodes which is configured to generate an output signal proportional to a time derivative of an electric field surrounding said electrodes.

8. The sensor as defined in claim 7 wherein the circuit comprises a first circuit electrically connected to said first and second electrodes, a second circuit electrically connected to said third and fourth electrodes and a third circuit electrically connected to said fifth and sixth electrodes.

9. The sensor as defined in claim 7 and comprising a cube shaped housing constructed of an electrical insulating material, and wherein said circuit is located within said housing and said electrodes are formed on outwardly facing surfaces of said housing such that the electrodes shield the circuit from external fields.

10. The sensor as defined in claim 9 wherein each electrode comprises a copper coating.

11. The sensor as defined in claim 7 wherein the first and second electrodes are aligned with the X-axis; the third and fourth electrodes are aligned with the Y-axis; and the fifth and sixth electrodes are aligned with the Z-axis, the X-, Y- and Z-axes being the standard orthogonal axes in three-dimensional space.

12. The sensor as defined in claim 7, wherein the electrodes forms an open, or partially closed, or completely closed surface.

13. The sensor as defined in claim 9, wherein the housing includes an opening in one or more of its corners.

14. A method of measuring an electric fields using the electric field sensor as defined in claim 7, the method comprising:
   placing the electric field sensor in a location where an electric field is present or will be present; and
   receiving, from the electric field sensor, an electrical signal proportional to a time derivative of an electric field surrounding the electrodes of the electric field sensor.

15. The method as defined in claim 14 further comprising:
   calculating a magnitude of the electric field from the electrical signal.

16. A method of assembling the electric field sensor as defined in claim 7, the method comprising:
   providing six circuit boards, one circuit board for each of the electrodes; and
   assembling the six circuit boards to form the housing for the electric field sensor.

17. The method as defined in claim 16, further comprising
   providing three more circuit boards, one for a first circuit electrically connected to said first and second electrodes, one for a second circuit electrically connected to said third and fourth electrodes and one for a third circuit electrically connected to said fifth and sixth electrodes, respectively; and
   assembling the three more circuit boards to be inside the housing.

18. The sensor as defined in claim 7, wherein the electrodes are ungrounded.

19. The sensor as defined in claim 1, wherein the sensor is configured as a stand-alone measurement instrument.

20. The sensor as defined in claim 6, wherein the second input of each of the transimpedance amplifiers are electrically connected together forming a virtual ground.

* * * * *